(12) United States Patent
Winczewski et al.

(10) Patent No.: US 12,007,108 B2
(45) Date of Patent: Jun. 11, 2024

(54) LIGHTING MODULE

(71) Applicant: Varroc Lighting Systems Electronics Romania S.r.l., Timişoara (RO)

(72) Inventors: Ryan Winczewski, Gallatin, TN (US); Michal Jablonski, Stalowa Wola (PL); Udo Jacobs, Königswinter (DE); Ivo Pavlik, Stará Ves (CZ); Jakub Černoch, Petřvald (CZ); Miroslav Pelc, Kladeruby (CZ)

(73) Assignee: VARROC LIGHTING SYSTEMS ELECTRONICS ROMANIA S.R.L., Timisoara (RO)

(*) Notice: Subject to any disclaimer, the term of this patent is extended or adjusted under 35 U.S.C. 154(b) by 0 days.

(21) Appl. No.: 18/197,533

(22) Filed: May 15, 2023

(65) Prior Publication Data

US 2023/0375172 A1    Nov. 23, 2023

Related U.S. Application Data

(60) Provisional application No. 63/342,822, filed on May 17, 2022.

(51) Int. Cl.
| | |
|---|---|
| *F21V 29/74* | (2015.01) |
| *F21V 29/503* | (2015.01) |
| *F21V 29/60* | (2015.01) |
| *H05K 1/02* | (2006.01) |
| *H05K 7/20* | (2006.01) |
| *F21V 19/00* | (2006.01) |
| *F21Y 115/10* | (2016.01) |

(52) U.S. Cl.
CPC .......... *F21V 29/745* (2015.01); *F21V 29/503* (2015.01); *F21V 29/60* (2015.01); *H05K 1/0203* (2013.01); *H05K 7/20145* (2013.01); *F21V 19/0015* (2013.01); *F21Y 2115/10* (2016.08)

(58) Field of Classification Search
CPC .......... F21V 29/83; F21V 29/74; F21V 29/75; F21V 29/773; F21V 3/02; F21V 29/763; F21V 29/777; F29V 29/503; F29V 29/60
See application file for complete search history.

(56) References Cited

U.S. PATENT DOCUMENTS

2011/0228529 A1* 9/2011 Patel ............... F21V 23/009
                                                165/104.11

\* cited by examiner

*Primary Examiner* — William J Carter
(74) *Attorney, Agent, or Firm* — Shumaker, Loop & Kendrick, LLP (57) ABSTRACT

A lighting module with an efficient heatsink. The heatsink may include a base conducting portion, side fins, and a center structure. The side fins may extend away from the base portion in such a way that the distance between the fins and the center structure may vary as they may extend away from the base portion. Warm air near the base conducting portion may rise due to natural convection buoyancy, in which vertical narrowing passages may result in the passive air flow increasing in velocity as it may travel near the narrowing surface area of the heatsink improving heat transfer, and as the side fins and center structure air passages widen, the air velocity may reduce as the warm air may be distributed above heatsink.

9 Claims, 7 Drawing Sheets

LIGHTING MODULE

CROSS-REFERENCE TO RELATED APPLICATIONS AND PRIORITY

The present application claims priority from U.S. Provisional Patent Application No: U.S. 63/342,822 file May 17, 2022, Title: "A Vehicle Lighting Module".

TECHNICAL FIELD

This invention relates to a vehicle lighting module and, more particularly, to a heat management device secured to a printed circuit board (PCB) of the vehicle lighting module.

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to implementations of the claimed technology.

Light emitting diodes (LED's) are used extensively in the automobile lighting industry. LED's that are designed to emit light in the visible spectrum, but generate a significant amount of heat, e.g., approximately 65-80% of the input energy received by the LED is converted to heat, with the remainder converted to light.

Conventionally, heatsinks are used to cool and dissipate heat generated by the printed circuit board or light modules or LEDs or semiconductor power devices, and the like. A general heatsink is made of a metal material having good thermal conductivity such as pure aluminum or an aluminum alloy. A common strategy is to use a metal core board that is manually mounted (by screw, rivet, clinching, etc.) to a heatsink that is typically a large die-casting or extrusion or clinched style aluminum piece with or without common baseplate. Many of these also require thermal conductive paste between the printed circuit board and heatsink to conduct the heat to the heatsink.

These heatsinks must have sufficient number of fins and surface area to make up for the poor thermal conductivity of the thermal paste which usually makes the module grow in size and weight. These heatsinks typically have fins that are perpendicular to the printed circuit board base surface and are usually repeated to get sufficient surface area. For natural convection these are typically evenly spaced increments of ~5-8 mm between fins. These fins typically project out, in a perpendicular direction, of the board due to die draw and draft of molds. As a result, the structure involves more material and is heavier than a module of equivalent surface area that does not involve the heatsink base plate.

An alternative method uses a special sub-mount type of LED light source that is placed directly on the heatsink. This system typically involves stamping and attachment of the LED with some thermally conductive glue and aligning and adhering the semiconductor on that glue. This requires a separate PCB with ribbon or gold wire bonds to have electrical connection to the component as the top-contact LED which makes this method a complex technique from the industrialization point of view. The heat generated by LED is passed to thermally conductive glue first and then further passed-on to the heatsink to dissipate the heat from the system. This method has a good heat dissipation efficiency but gives rise to reliability issue with respect to LED glue attachment under humid environment conditions. Furthermore, the aforementioned design has an issue of being more susceptible to damage during the manufacturing process due to fragile electrical bonds that could be easily damaged and have the potential to produce latent failures.

Hence there is a need of a heat management device or a heatsink device which is simple and compact in design but efficiently dissipating the heat generated by the light module.

Further there is a necessity to provide a heatsink device which has low manufacturing cost and has a higher reliability in long run.

Furthermore, there is a need of heatsink device with a structure which increases the passive air flow acceleration, and which maximizes the cooling surface area and air velocity that develops as a result of natural convection while minimizing the volumetric envelope of the device.

SUMMARY OF THE INVENTION

This summary is provided to introduce the concepts related to a heat management device secured to a printed circuit board (PCB) of a lighting module. It is to be understood that this application is not limited to systems and methodologies described herein, as there can be multiple possible embodiments which are not expressly illustrated in the present disclosure. It is also to be understood that the terminology used in the description is for the purpose of describing the particular versions or embodiments only and is not intended to limit the scope of the present application. This summary is not intended to identify essential features of the claimed subject matter nor is it intended for use in determining or limiting the scope of the claimed subject matter.

In one embodiment a lighting module is disclosed. The lighting module may comprise a PCB board, a light source and a heatsink. The PCB board may comprise a front surface, a back surface, and peripheral edges of the board material. Further, the light source may be attached to the front surface of the PCB board. Furthermore, the heatsink may be a surface mount device attached to the back surface of the PCB board, and the heatsink may be further shaped and configured to dissipate the heat generated by the light source. Further, the heatsink may comprise of a base conducting portion, side fins, and a center structure. The base conducting portion may be attached on the back surface of the PCB board. Further, the side fins may extend away from the base portion in such a way that the distance between the fins and the center structure may vary as they extend away from the base portion. Further, air passages may be formed between the center structure and the side fins. Further, warm air near the base conducting portion may rise due to natural convection buoyancy, in which vertical narrowing passages may result in the passive air flow increasing in velocity as it may travel near the narrowing heat dissipating surface area of the heatsink improving heat transfer, and subsequently as the side fins and center structure air passages widen, the air velocity may reduce as the warm air is distributed above heatsink.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF DRAWINGS

The detailed description is described with reference to the accompanying figures. The same numbers are used throughout the drawings to refer like features and components.

DETAILED DESCRIPTION OF THE INVENTION

Reference throughout the specification to "various embodiments," "some embodiments," "one embodiment." or "an embodiment" means that a particular feature, structure, or characteristic described in connection with the embodiment is included in at least one embodiment. Thus, appearances of the phrases "in various embodiments," "in some embodiments," "in one embodiment" or "in an embodiment" in places throughout the specification are not necessarily all referring to the same embodiment. Furthermore, the particular features, structures or characteristics may be combined in any suitable manner in one or more embodiments. Following is an example which is illustrative only and invention accommodates any and every variation of the example provided below that shall serve the same purpose and is obvious to a person skilled in the art.

Before describing the present invention in detail, it should be observed that the present invention constitutes a vehicle lighting module which mainly relates to passive air flow acceleration heat management device, and which is achieved by the structure of the heatsink disclosed herein. Accordingly, the components have been represented, showing only specific details that are pertinent for an understanding of the present invention so as not to obscure the disclosure with details that will be readily apparent to those with ordinary skill in the art having the benefit of the description herein.

In accordance with one embodiment, a vehicle lighting module is illustrated. The vehicle lighting module may comprise a heatsink. The heatsink may be a folded sheet metal structure attached to the back surface of a PCB. Further, the heatsink may comprise of a base portion with one side of the base portion attached on to back surface of the PCB and other side may have side fins extending away from the base and the distance between the fins may vary as the said fins may extend away from the base portion. In one of the embodiments the central portion of the heatsink may comprise a center structure which may be a part of the folded metal sheet and may have a same base portion as that of fins which may extend from the edges of the same base portion of the heatsink. Such structure might form a plurality of air flow passages between the fins, wherein due to natural convection, the air near the heat generating region of PCB may rise and travel away from the heated region of the PCB.

In another embodiment, the center structure may be located substantially at the central part of the heatsink. Further, the said center structure may be a part of heatsink folded metal sheet structure which may form an air flow passage and a pinch area between fins and the center structure near to the base portion. Further, the center structure may have a same base portion of the heatsink may have apertures where the air may travel from PCB to a hollow channel of the center structure and away from the base portion. Further, the air may pass through the apertures. The apertures may increase the velocity of the air passing through it to maintain constant overall flow of the natural convection, thereby dissipating more heat at faster rate and further may distribute the warm air away from the heat generating components while exiting the apertures.

The airflow passage created by the fins and the center structure may have a wide region near the base portion and due to natural convection, the air may rise and travel away from the heated region near PCB, thereby dissipating the heat from the heat generating components and flowing upward towards the pinch area, which is a restricted or narrow air flow passage. The air flow velocity increases when passing through the restricted or narrow air flow passage and allowing more heat to be dissipated at faster rate. Further the air flow may again enter the wider region where more heat is further dissipated while then starting to decrease velocity as it exits the heatsink which distributes the warm air away from the PCB or LED or heat generating regions of vehicle lighting module.

Figure 1:
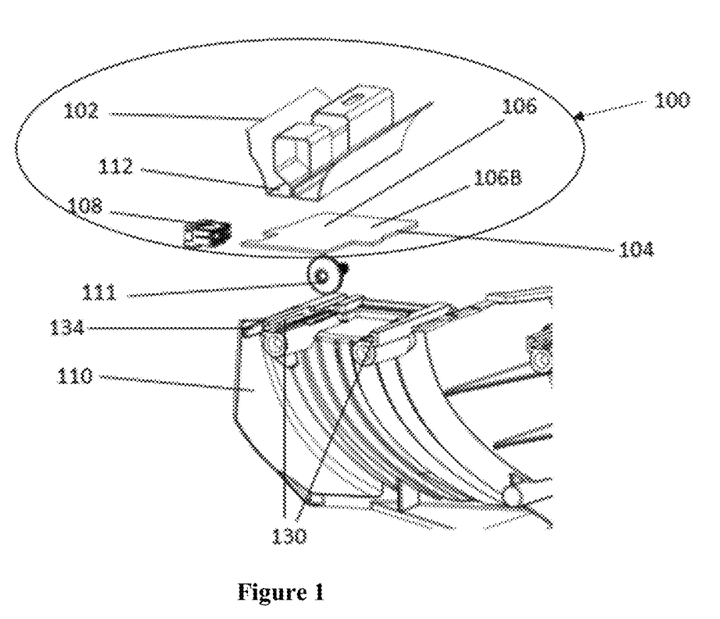
FIG. 1 is an exploded isometric view of the components of the vehicle lighting module, in accordance with an exemplary embodiment of the invention.

Referring to FIG. 1, an exploded isometric view of a vehicle lighting module 100 is illustrated in accordance with an embodiment of the present subject matter. The vehicle lighting module 100, as shown in FIG. 1, may comprise of a reflector 110, a LED 122 soldered to a Printed Circuit Board (PCB) 106 at a front surface 106A and a heatsink 102 attached on the back surface 106B of the PCB 106. The said PCB 106, in one of the embodiments, is at least a two layer, FR4 laminate-based structure with plated vias running underneath the insulated thermal pad (not shown in figures) of the LED 122 for improved thermal conductivity on one side i.e., front surface 106A of the PCB 106, whereas, on the other side i.e., back surface 106B of the PCB 106 is attached to a heatsink 102, which allows the heat generated from heat generating components to conduct through the module and to dissipate away.

The heatsink 102 in one of the embodiments may be a surface mount device made by folding a metal sheet into a shape resembling a finned structure. Further, the heatsink 102 may have a base portion 112 with one side of the base portion 112 attached on the back surface 106B of PCB 106 with the help of fasteners and other side of the base portion 112 is enabled with fins 114 extending away from the base portion 112 in such a way that the distance between the fins 114 vary as they extend away from the base portion 112.

Figure 2A:
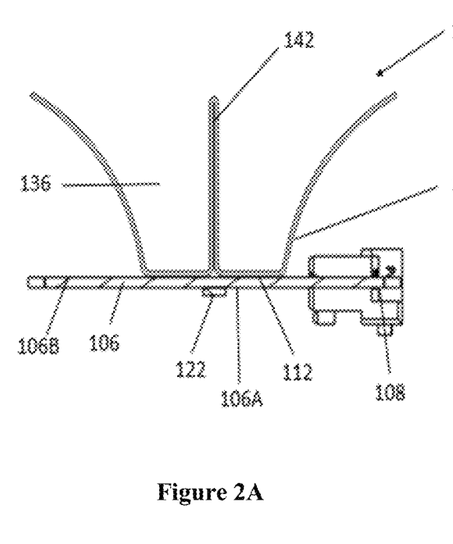
FIG. 2A illustrates a sectional front view of the heatsink of the vehicle lighting module, in accordance with an exemplary embodiment of the invention.

Now referring to FIG. 2A a sectional front view of the heatsink 102 and Printed Circuit board (PCB) 106 is illustrated. Further, referring to FIG. 2B a sectional front view of the heatsink 102 is illustrated. The heatsink 102 and the PCB 106 is enabled with apertures 128 for enabling an airflow from bottom towards the top of the fins 114.

Figure 2B:
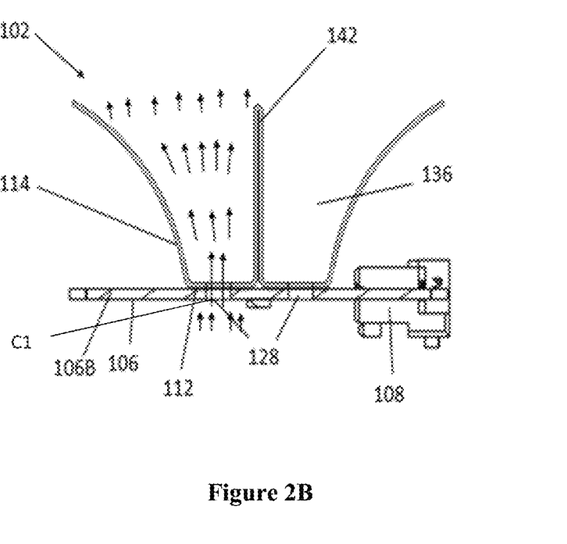
FIG. 2B is a sectional front view of the heatsink showing an airflow in the heatsink with PCB of the vehicle lighting module, in accordance with an exemplary embodiment of the invention.

The heatsink 102 in FIGS. 2A & 2B may be a stamped metal, surface mount heatsink 102, having a base portion 112. One side of the base portion 112 may be attached on the back surface 106B of PCB 106 and at least two fins 114 may be configured to extend from base portion 112 from the other side of the heatsink 102. The front surface 106A of the PCB may be soldered with LED 122. Further, the distance between the fins 114 may vary as the fins 114 extend away from the base portion 112.

In one embodiment, the said fins 114 may be of a curved structure or an angular structure and in some embodiments the fins 114 may be substantially straight with the distance between the fins 114 varying as they extend away from the base portion 112 of the heatsink 102.

Further, the central portion of the heatsink 102 in the present embodiment may have a center structure 142. The center structure 142 may be a part of the folded metal sheet structure and may have a same base portion 112 as that of fins 114 which may extend from the edges of the same base portion 112 of the heatsink 102. This structure might form a plurality of air flow passages 136 between the fins 114 and the center structure 142 and due to natural convection, the air near the heat generating region of PCB 106 may rise and travel away from the base portion 112 and heated region of the PCB 106. The airflow passages 136, as represented in FIG. 2A and FIG. 2B, may include the fins 114 with center structure 142 to form a curved or angular passages 136 of air flow with varying distance between the fins 114 and 142 and further extending away from the base portion 112 of the heatsink 102.

Referring to FIG. 2B, a sectional front view of the heatsink 102 showing an airflow direction through an aperture 128 is illustrated in accordance with an embodiment of the present subject matter. The center structure 142 may be of a such a shape of the sheet metal that it may form an air flow passage 136 with fins 114 extending from the base portion 112 with varying distance between the fins 114 and the center structure 142 as they may extend away from the base portion 112. Due to natural convection the heated air from PCB 106 region may rise and travel to the wider region away from the base portion 112. Further, due to natural convection the heated air from PCB 106 region may rise and travel through the apertures 128 thereby accelerating a first air convection current (C1). Further, the air velocity while passing through the apertures 128 may increase as shown by a longer arrow near the base portion 112 in the FIG. 2B, thereby dissipating heat at a faster rate and further in wider region downstream of aperture 128 away from the base portion 112. The air velocity may vary as per the area of air flow passage 136 vary and then exiting the heatsink 102 by dissipating more warm air as shown by a shorter arrows in FIG. 2B.

Moreover, as represent in FIG. 2B, due to the natural convection, the air may rise and travel from heated PCB 106 region and through base portion 112 flows further directly into the air flow passages 136 formed by the fins 114 and the center structure 142 where the air velocity may keep varying as per the area of air flow passage 136 width and then exits the heatsink 102 by dissipating more warm air away from the base portion 112 as shown by shorter arrows in FIG. 2B.

Figure 3A:
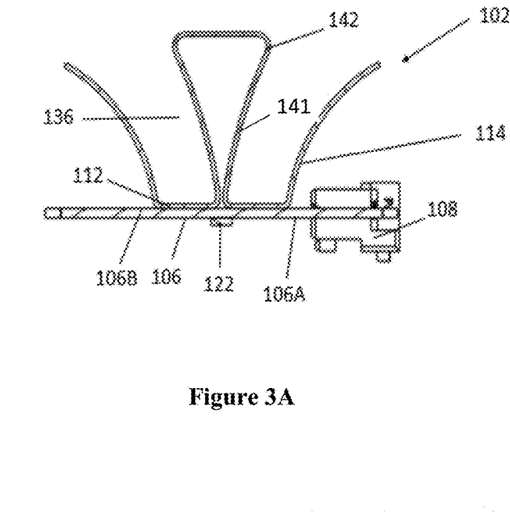
FIG. 3A, is one of the embodiments showing sectional front view of the heatsink components of the vehicle lighting module, in accordance with an exemplary embodiment of the invention.
Figure 3B:
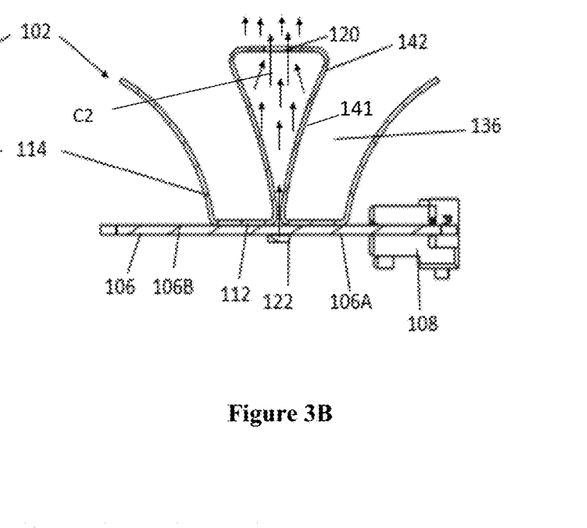
FIGS. 3B and 3C are sectional front views of the embodiment, disclosed in FIG. 3A, showing an airflow through heatsink associated with PCB of the vehicle lighting module, in accordance with an exemplary embodiment of the invention.
Figure 3C:
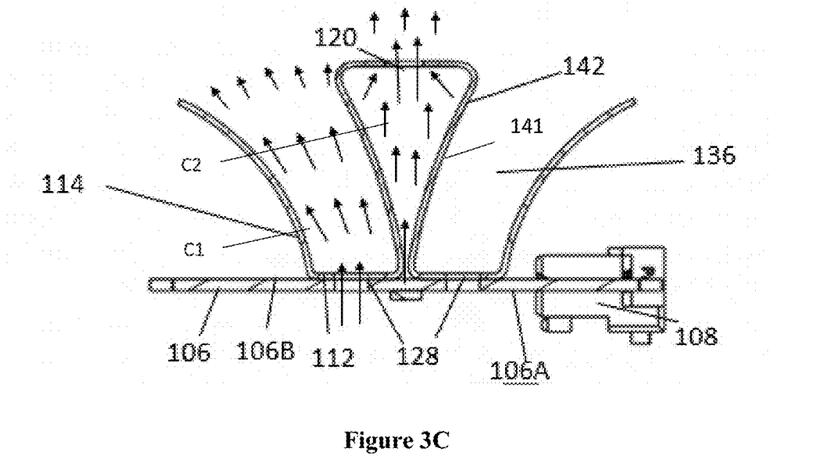

Now referring to FIG. 3A, a sectional front view of the heatsink 102 and Printed Circuit board (PCB) 106 is illustrated in accordance with an embodiment of the present subject matter. FIGS. 3B and 3C illustrate sectional front view of the embodiment 3A with apertures 120 and 128. An airflow passage is enabled in the heatsink 102 and PCB 106, in accordance with an embodiment of the present subject matter.

The heatsink 102 in FIGS. 3A, 33, and 3C may be a stamped metal, surface mount heatsink 102 which may have a base portion 112 with one side of the base portion 112 attached on the back surface 106B of PCB 106 and at least two fins 114 extending from base portion 112 from the other side of the heatsink 102 whereas the front surface 106A of the PCB may be soldered with LED 122. Further, the distance between the fins 114 may vary as the fins 114 may extend away from the base portion 112.

In one of the embodiments the said fins 114 may be of a curved structure or an angular structure and in some embodiments the fins 114 may be substantially straight, wherein with the distance between the fins 114 may be kept varying as they extend away from the base portion 112 of the heatsink 102.

Further, the central portion of the heatsink 102 in present embodiment of FIG. 3A has a center structure 142 which may be a part of the folded metal sheet and may form a substantially hollow triangular center structure 142 with wider region of the triangular shape being away from the base portion 112 and that the fins 114 may extend from the edges of the same base portion 112 of the heatsink 102. This structure may form a plurality of air flow passages 136 between the fins 114 and the center structure 142 and due to natural convection, the air near the heat generating region of PCB may rise and travel away from the heated region of the PCB 106. The airflow passages 136 in an embodiment 3A, 3B and 3C discloses a structure, which may include the fins 114 with center structure 142 to form a substantially parallel or uniform curved or angular passages 136 of air flow with varying distance between the fins 114 and further extending away from the base portion 112 of the heatsink 102.

Referring to FIG. 3B, an embodiment of FIG. 3A which illustrates a sectional front view of the embodiment 3A with apertures 120 and showing an airflow in heatsink 102 with PCB 106 respectively of the vehicle lighting module 100, in accordance with the present subject matter. The central portion of the heatsink 102 in present embodiment 3B has a center structure 142 which may be a part of the folded metal sheet and may form a substantially hollow triangular center structure 142 with wider region of the triangular shape being away from the base portion 112 and that the fins 114 extends from the edges of the same base portion 112 of the heatsink 102. Further, the said wider region of fin 142 has an aperture 120 at the top surface 138. The center structure 142 with such a shape of the sheet metal may form a substantially parallel or uniform air flow passage 136 with fins 114 extending from the base portion 112 with varying distance between the fins 114 as they may extend away from the base portion 112.

Further, due to natural convection, the heated air from PCB 106 region may rise and travel to the wider region away from the base portion 112. The air inside the hollow channel 118 is heated by the side walls 141 thereby generating additional air convection current (C2) inside the hollow channel 118. Further, the second air convection current (C2) is accelerated through the aperture 120 and/or the air gap 126. The air convection current (C2) enters the heatsink 102 from a front opening 142a of hollow channel 118 and exits through a rear opening 142b of hollow channel 118 and the aperture 120 and/or the air gap 126. The air velocity while passing through the aperture 120 and narrow region of the triangular shaped center structure 142, increases as shown by the longer arrow near the base portion 112 and at the top surface 138 in the FIG. 3B, thereby dissipating heat at a faster rate and further flowing into the wider region downstream of the aperture 128 and away from the base portion 112. During operation, the velocity of the air convection current keeps varying as the area of air flow passage 136 vary and then exits the heatsink 102 by dissipating more warm air as shown by shorter arrows in FIG. 3B.

Furthermore, in FIG. 3B, due to the natural convection, the air may rise and travel from heated PCB 106 region and through base portion 112 may flow further directly into the air flow passages 136 formed by the fins 114 and the center structure 142. The air velocity may vary as per the area of air flow passage 136 vary and then exits the heatsink 102 by dissipating more warm air away from the base portion 112 as shown by shorter arrows in FIG. 3B.

Now referring to FIG. 3C, an embodiment of FIG. 3A which illustrates a sectional front view of the embodiment 3A with apertures 120 and 128 and showing an airflow in heatsink 102 with PCB 106 respectively of the vehicle lighting module 100, in accordance with the present subject matter. The central portion of the heatsink 102 in present embodiment of FIG. 3C has a center structure 142 which may be a part of the folded metal sheet and may form a substantially hollow triangular center structure 142 with wider region of the triangular shape being away from the base portion 112 and that the fins 114 extends from the edges of the same base portion 112 of the heatsink 102. Further, the said wider region of fin 142 has an aperture 120 at the top surface 138 and apertures 128 on the base portion 116 of the heatsink 102. The center structure 142 with such a shape of the sheet metal may form a substantially parallel or uniform air flow passage 136 with fins 114 extending from the base portion 112 with varying distance between the fins 114 as they may extend away from the base portion 112.

Further, due to natural convection, the heated air from PCB 106 region may rise and travel to the wider region away from the base portion 112. The center structure 142 may comprise of a top portion 138 and side walls 141 forming a hollow channel 118. The air inside the hollow channel 118 is heated by the side walls 141 thereby generating additional air convection current (C2) inside the hollow channel 118. The air convection current (C2) enters the heatsink 102 from a front opening 142a of hollow channel 118 and exits through a rear opening 142b of hollow channel 118 and the aperture 120 and/or the air gap 126. Further, the second air convection current (C2) is accelerated through the aperture 120 and/or the air gap 126. Due to natural convection the heated air from PCB 106 region may rise and travel through the aperture 120 accelerating a first air convection current (C1). The air velocity while passing through the aperture 120 and 128 and from the narrow region of the triangular shaped center structure 142, increases as shown by the longer arrows near the base portion 112 and at the top surface 138 in the FIG. 3C, thereby dissipating heat at a faster rate and further flowing into the wider region downstream of the aperture 120 and 128 and narrow region of the triangular shaped center structure 142 and away from the base portion 112. The air velocity may keep varying as per the area of air flow passage 136 vary and then exiting the heatsink 102 by dissipating more warm air as shown by shorter arrows in FIG. 3C.

Figure 4A:
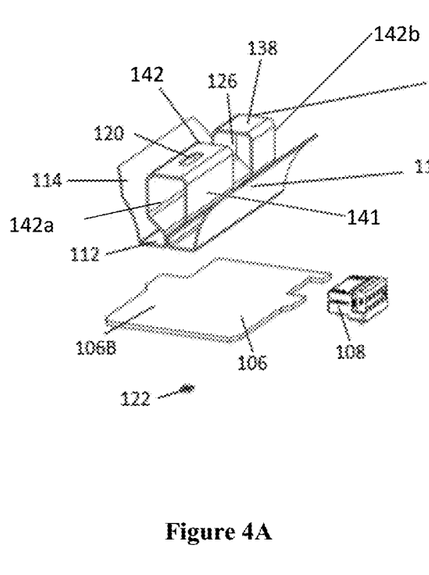
FIG. 4A is one of the embodiments showing exploded isometric view of the heatsink of the vehicle lighting module, in accordance with an exemplary embodiment of the invention.

Now referring to FIG. 4A an exploded isometric view of the heatsink 102 and Printed Circuit board (PCB) 106, is illustrated in accordance with the present subject matter respectively.

The heatsink 102 in FIG. 4A may have a base portion 112 with one side of the base portion 112 may be attached on the back surface 106B of PCB 106 and at least two fins 114 may extend away from base portion 112 on the other side of the heatsink 102. The front surface 106A of the PCB may be soldered with LED 122. Further, the distance between the fins 114 may vary as the said fins 114 may extend away from the base portion 112.

Further, the central portion of the heatsink 102 is a center structure 142, which may be a part of the folded metal sheet and has a same base portion 112. The said center structure 142 may have a hollow enclosed passage or a hollow channel 118, with said passage having a front opening 142a and a rear opening 142b. Further the center structure 142 may comprise of a central air gap 126 provided for higher heat dissipation capacity and may have apertures 120 at the top surface 138.

Figure 4B:
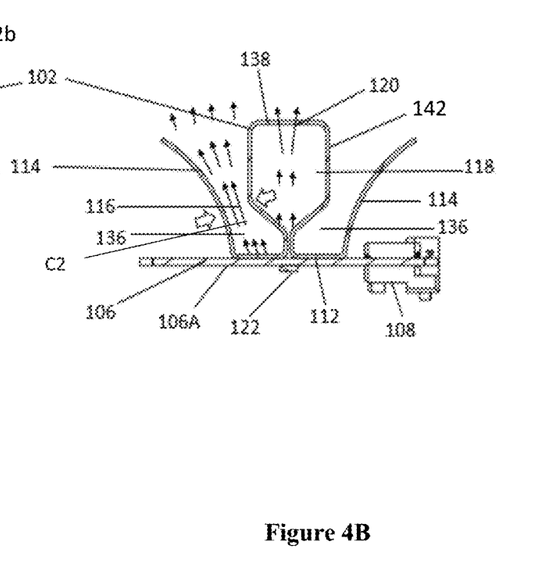
FIG. 4B is a sectional front view of the embodiment, disclosed in FIG. 4A, showing an airflow through heatsink associated with PCB, in accordance with an exemplary embodiment of the invention.

Referring to FIG. 4B, a sectional front view of the heatsink 102 showing an airflow direction from PCB 106, is illustrated in accordance with the present subject matter. Further, an air flow passage 136 may be formed between the side fins 114 and side wall 141. Further the air flow passage 136 near to base portion 112 may be narrow forming a pinch area 116.

Due to natural convection the heated air from PCB 106 region may rise and travel to the wider region near the base portion 112. Further, the air velocity near the base portion 112 may be low as shown by the shorter arrows in FIG. 4B, and as the air flow reaches near the pinch area 116 the air velocity increases as shown by longer arrows in FIG. 4B, thereby dissipating heat at a faster rate and further reaching up to another wider region downstream of pinch area 116 away from the base portion 112 and exiting the heatsink 102 by dissipating more warm air as shown by shorter arrows in FIG. 4B that are at a lower velocity.

Further, the air inside the hollow channel 118 is heated by the side walls 141 thereby generating additional air convection current (C2) inside the hollow channel 118. The air convection current (C2) enters the heatsink 102 from a front opening 142a of hollow channel 118 and exits through a rear opening 142b of hollow channel 118 and the aperture 120 and/or the air gap 126. Further, the second air convection current (C2) is accelerated through the aperture 120 and/or the air gap 126. Further, again due to the natural convection, the air may rise and travel from heated PCB 106 region into a hollow channel 118 of the center structure 142 and away from the base portion 112, here the air velocity is low as shown by shorter arrow in FIG. 4B, while further passing through the apertures 120 the air velocity increases distributing the warm air away from the heat generating components happens at a faster rate while exiting the apertures 120 from the top surface 138 of the center structure 142.

Figure 5A:
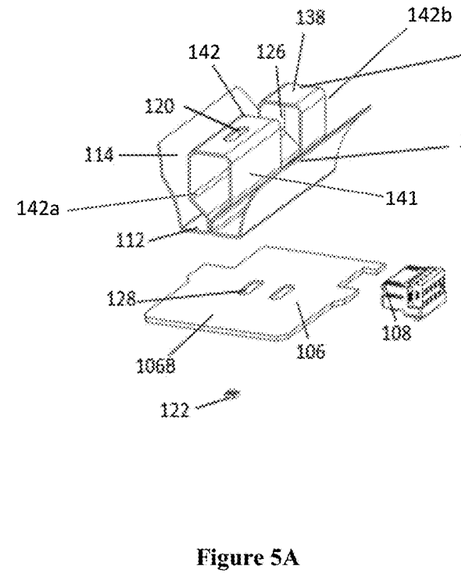
FIG. 5A is one of the embodiments showing an exploded isometric view of a heatsink of the vehicle lighting module, in accordance with an exemplary embodiment of the invention.
Figure 5B:
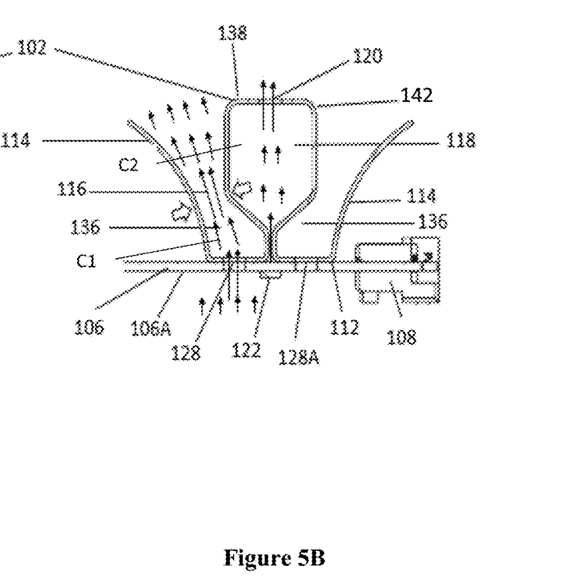
FIG. 5B is a sectional front view of the embodiment, disclosed in FIG. 5A, showing an airflow through heatsink associated with PCB, in accordance with an exemplary embodiment of the invention.

Now referring to FIGS. 5A and 5B, an exploded isometric view of a Heatsink 102 and Printed Circuit board (PCB) 106 as well as a sectional front view of the Heatsink 102 with PCB 106 is illustrated respectively. The heatsink 102 in FIG. 5A may have a base portion 112 with one side of the base portion 112 attached on the back surface 106B of the PCB 106 and at least two tins 114 may be extended from base portion 112 on the other side of the heatsink 102. The front surface 106A of the PCB 106 may be soldered with LED 122. Further, the said base portion 112 has apertures 128A as shown in FIG. 5B, whereas the PCB 106 may also have apertures 128 around the central portion as shown in FIG. 5A and both apertures 128 and 128A may be substantially matched together while attaching heatsink 102 to PCB 106. Further, the distance between the fins 114 may vary as the said fins 114 may extend away from the base portion 112.

In one of the embodiments the said fins 114 may be of a curved structure and in some embodiments the fins 114 may be substantially straight but the distance between the fins 114 may keep varying as they extend away from the base portion 112 of the heatsink 102. Further, the central portion of the heatsink 102 is a center structure 142 which may be a part of the folded metal sheet and may have a same base portion 112. The said center structure 142 may have a hollow channel 118 with said passage having an opening at both ends. Further the center structure 142 may comprise of a central air gap 126 provided for higher heat dissipation capacity and has an apertures 120 at the top surface 138.

Referring to FIG. 5B, the sectional front view of the heatsink 102 showing an airflow direction from PCB 106, is illustrated in accordance with the present subject matter. The center structure 142 may form an air flow passage 136. The said center structure 142 may have a hollow enclosed passage or a hollow channel 18, with said passage having a front opening 142a and a rear opening 142b. Further, the area near the base portion 112 may be wider and may gradually narrow to form a pinch area 116 between fins 114 and center structure 142 which may be substantially near to the base portion 112 and further may become wider to the downstream of pinch area 116 and away from the base portion 112. Due to natural convection the heated air from PCB 106 region may rise and travel through the apertures 128 and 128A accelerating a first air convection current (C1). Further, the air velocity may increase as shown by the longer arrows in figure SB, which may further travel to the wider region near the base portion 112. The air velocity near the base portion 112 is low as shown by the shorter arrows in FIG. 5B, and as the air flow reaches near the pinch area 116 the air velocity may again increase as shown by longer arrows in FIG. 5B, thereby dissipating heat at a higher velocity at aperture 128 and 128A region and at the pinch area 116 thereby reaching up to another wider region away from the base portion 112 and exiting the heatsink 102 by dissipating more warm air again shown by shorter arrows in figure SB that are at a lower velocity.

The center structure 142 may comprise of a top portion 138 and side walls 141 forming a hollow channel 118. The air inside the hollow channel 118 is heated by the side walls 141 thereby generating additional air convection current (C2) inside the hollow channel 118. The air convection current (C2) enters the heatsink 102 from a front opening 142a of hollow channel 118 and exits through a rear opening 142b of hollow channel 118 and the aperture 120 and/or the air gap 126. Further, the second air convection current (C2) is accelerated through the aperture 120 and/or the air gap 126. Moreover, again due to the natural convection, the air may rise and travel from heated PCB 106 region into a hollow channel 118 of the center structure 142 and away from the base portion 112, here the air velocity is low as shown by shorter arrow, while further passing through the apertures 120 the air velocity may increase distributing the warm air away from the heat generating components executes at a faster rate while exiting the apertures 120 from the top surface 138 of the center structure 142.

Figure 6:
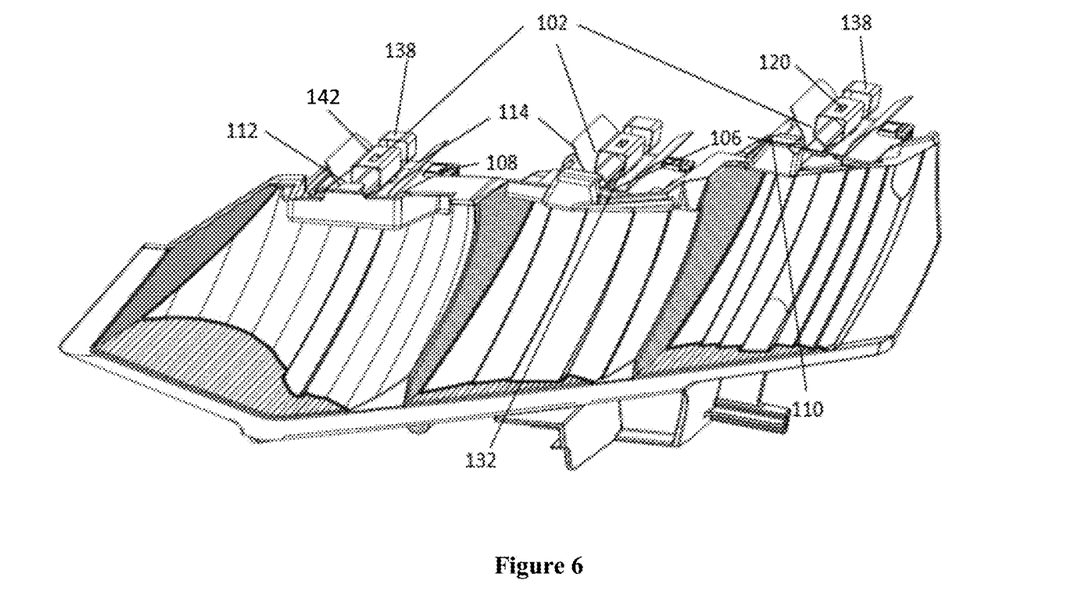
FIG. 6 is an illustration of heatsink assembled to the PCB board of the vehicle lighting module, in accordance with an exemplary embodiment of the invention.

Now referring to FIG. 6, an embodiment of the heatsink 102, in accordance with the present subject matter is illustrated. FIG. 6 shows a heatsink 102 which may have a base portion 112. One side of the base portion 112 is attached to the back surface 106B of the PCB 106 whereas the other side has fins 114 extending away from the base portion 112. The distance between the fins 114 may vary as the said fins 114 may extend away from the base portion. The fins 114 in one embodiment may be curved or angular shaped and, in another embodiment, may be substantially straight but the distance between the fins 114 may keep varying as they may extend away from the base portion 112 of the heatsink 102. The central portion disclosed herein may be a center structure 142 in triangular structure with tip of the triangle may be at the base portion 112 and flat surface may be extended away from the base portion 112. Further, the flat surface may have apertures 120. The said center structure 142 forms an air flow passage 136. The air from the heat generation area near PCB 106 may rise up due to natural convection and may travel away from the base portion 112 dissipating the heat. The air may also flow through the center structure 142 and passes through the apertures 120 at the top surface 138. Further, the air flow velocity may increase, and more heat may be dissipated.

In another embodiment of FIG. 6 (not shown in figures) may be a heatsink 102 which may have a base portion 112 one side of the base portion 112 may have been attached to the back surface 106B of the PCB 106 whereas the other side has fins 114 extruding away from the base portion 112. The distance between the fins 114 may vary as the said fins 114 may extend away from the base portion 112. The fins 114 in one embodiment may be curved and, in another embodiment, may be substantially straight but the distance between the fins 114 may keep varying as they may extend away from the base portion 112 of the heatsink 102. The central portion disclosed herein is a center structure 142 in triangular structure with tip of the triangle is at the base portion 112 and flat surface extended away from the base portion 112. Further, the flat surface may have apertures 120.

The said base portion 112 may have apertures 128A as shown in FIG. 5B whereas the PCB 106 may also have apertures 128 around the central portion as shown in FIG. 5A and both apertures 128 and 128A may be substantially matched together while attaching heatsink 102 to PCB 106. Due to natural convection the heated air from PCB 106 region may rise and travel through the apertures 128 and 128A. The air velocity may increase which further travels to the wider region near the base portion 112. The velocity of the air flow may change throughout the air flow passage 136 depending on the shape and cross-sectional area of the air flow passage 136 and it may continue to rise exiting the heatsink 102 by dissipating more warm air again shown by shorter arrows in FIG. 5B that end at a lower velocity. The said air also flows through the center structure 142 in FIG. 6 and passes through the apertures 120 at the top surface 138, the air flow velocity may further increase, and more heat may be dissipated.

Figure 7:
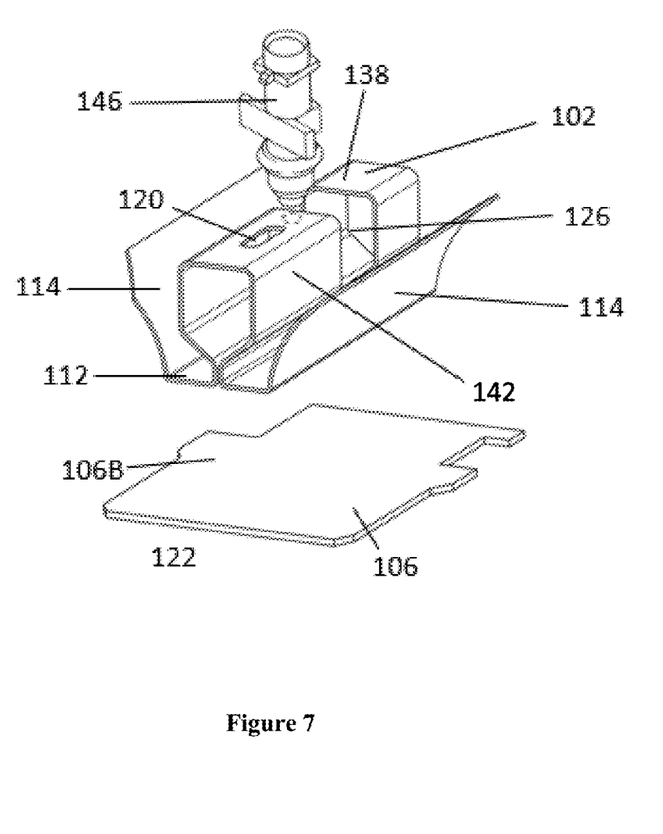
FIG. 7 is an exploded view, illustrating pick and place equipment of heatsink assembly process, in accordance with an exemplary embodiment of the invention.

Now referring to FIG. 7, isometric view of a pick and place process of assembling heatsink 102 on PCB 106, is illustrated in accordance with the present subject matter. In FIG. 7 a heatsink 102 may have a base portion 112 with one side of the base portion 112 may be attached on the back surface 106B of PCB 106 and at least two fins 114 may extend away from base portion 112 on the other side of the heatsink 102. The front surface 106A of the PCB may be soldered with LED 122. Further, the distance between the fins 114 may vary as the said fins 114 may extend away from the base portion 112. The central portion of the heatsink 102 is a center structure 142 which may be a part of the folded metal sheet and may have the same base portion 112. The said center structure 142 may comprise of a top portion 138 and side walls 141 forming a hollow channel 118, with said passage may have an opening at both ends. Further the center structure 142 may comprise of a central air gap 126 provided for higher heat dissipation capacity and may have apertures 120 at the top surface 138.

Further, the said top surface 138 of the heatsink 102 may be a flat, horizontal surface to allow the pick and a place equipment 146 to pick up the heatsink 102 and place it on the PCB panel where the heatsink 102 may be mounted. The said PCB 106 panel may be subjected to solder paste application in a screen-printing Process (not shown in figures). Further, all the components (not shown in figures) that requires soldering may be pick and place on the PCB 106 panel by pick and place equipment 146. Once all the components are placed on the PCB panel 106, this assembly may be taken into reflow oven, where the said assembly may be exposed to the temperature ramp profile which is required to attached placed components on PCB panel 106. On termination of this process, the PCB panel 106 may be then turned around for assembling heatsink 102 on the PCB panel 106 and solder paste may be applied on the PCB panel may be, but not limiting to, by dispensing method. Further, the heatsink 102 may be pick and placed by the pick and place equipment 146 and taken into the reflow oven where the heatsink 102 with PCB panel 106 may be exposed to second reflow run which attaches Heatsink 102 to the PCB panel 106.

The lighting module 100 of the present subject matter has, but are not limited to, following benefits/advantages:

The lighting module has a heat management device which increases the passive air flow acceleration, and which maximizes the cooling surface area and air velocity that develops as a result of natural convection while minimizing the volumetric envelope of the device.

The lighting module has a heat management device with simple and compact in design but efficiently dissipating the heat generated by the light module.

The lighting module has a heat management device which has low manufacturing cost and has a higher reliability.

The embodiments, examples and alternatives of the preceding paragraphs, the description, including any of their various aspects or respective individual features, may be taken independently or in any combination. Features described in connection with one embodiment are applicable to all embodiments unless such features are incompatible.

The foregoing description of the specific embodiment will so fully reveal the general nature of the embodiment herein that others can, by applying current knowledge, readily modify and/or adapt for various applications such specific embodiment without departing from the generic concept, and, therefore, such adaptations and modifications should and are intended to be comprehended within the meaning and range of equivalents of the disclosed embodiment. It is to be understood that the phraseology or terminology employed herein is for the purpose of description and not of limitation. Therefore, while the embodiment herein has been described in terms of preferred embodiment, those skilled in the art will recognize that the embodiment herein can be practiced with modification within the spirit and scope of the embodiment as described herein.

LIST OF REFERENCE NUMERALS 122 light sources
100 lighting module
102 heatsink
106 PCB board
106a front surface of the PCB board
106b back surface of the PCB board
104 peripheral edges of the PCB board
108 reflector
112 base conducting portion of heatsink
114 side fins of heatsink
116 pinch area
120 aperture in top portion of the center structure
126 air gap
128 apertures in PCB board
128A apertures in base portion of heatsink
142 center structure
136 air flow passages
138 top portion of the center structure of heatsink
141 side walls of the center structure of heatsink
118 hollow channel in heatsink
142a front opening of hollow channel
142b rear opening of hollow channel
146 pick and a place equipment

The invention claimed is:

1. A lighting module, comprising:
a printed circuit board (PCB) board having a front surface, a back surface, and peripheral edges of the board material;
a light source, wherein the light source is attached to the front surface of the PCB board;
a heatsink, wherein the heatsink is a surface mount device attached to the back surface of the PCB board, and wherein the heatsink is shaped and configured to dissipate the heat generated by the light source, wherein the heatsink is a stamped metal heatsink, wherein the heatsink is made by folding a metal sheet into a finned structure, wherein the fins themselves are folded to make the heatsink with a plurality of air flow passages, wherein,
the heatsink comprises a base conducting portion, side fins, and a center structure, wherein the center structure comprises a top portion and sidewalls forming a hollow channel, wherein the hollow channel comprises a front opening and a rear opening, wherein the top portion of the center structure is enabled with an aperture in the metal, wherein the base conducting portion is attached on the back surface of the PCB board, wherein the side fins extending away from the base portion in such a way that the distance between the fins and the center structure vary as they extend away from the base portion, wherein air passages are formed between the center structure and the side fins and the warm air near the base conducting portion rises due to natural convection buoyancy, in which vertical narrowing passages result in the passive air flow increasing in velocity as it travels near the narrowing heat dissipating surface area of the heatsink improving heat transfer, and subsequently as the side fins and center structure air passages widen, the air velocity reduces as the warm air is distributed above heatsink.

2. The lighting module as claimed in claim 1, wherein the heatsink shape and cross-sectional area of the air flow passage changes the velocity of the air flow throughout the air flow passage as it continues to rise exiting the heatsink by dissipating the warm air.

3. The lighting module as claimed in claim 1, wherein the heatsink spacing and geometry of the side fins and the center structure are shaped and configured for passive air conditions.

4. The lighting module as claimed in claim 1, wherein the heatsink exposed metal surface area is maximized for improved heat dissipation transfer characteristics.

5. The lighting module as claimed in claim 1, wherein as a result of the passive natural convection air flow velocity increasing the volumetric envelope of the module can be minimized.

6. The lighting module as claimed in claim 1, wherein the air inside the hollow channel is heated by the side walls thereby generating additional air convection current (C2) inside the hollow channel, wherein the second air convection current (C2) is accelerated through the aperture and/or the air gap.

7. The lighting module as claimed in claim 1, wherein the base portion enabled with apertures and the PCB board is enabled with apertures.

8. The lighting module as claimed in claim 7, wherein the apertures of the base portion and the apertures of the PCB board are concentric.

9. The lighting module as claimed in claim 8, wherein the first air convection current (C1) is accelerated while flowing through the apertures of the base portion and the apertures of the PCB board.

* * * * *

UNITED STATES PATENT AND TRADEMARK OFFICE
CERTIFICATE OF CORRECTION

PATENT NO. : 12,007,108 B2  
APPLICATION NO. : 18/197533  
DATED : June 11, 2024  
INVENTOR(S) : Ryan Winczewski et al.

Page 1 of 1

It is certified that error appears in the above-identified patent and that said Letters Patent is hereby corrected as shown below:

On the Title Page (71) Applicant listed as:  
Varroc Lighting Systems Electronics Romania S.r.l., Timișoara, (RO)  
Should appear as follows:  
Varroc Electronics Romania S.r.l., Timișoara, (RO)

(73) Assignee listed as:  
Varroc Lighting Systems Electronics Romania S.r.l., Timișoara, (RO)  
Should appear as follows:  
Varroc Electronics Romania S.r.l., Timișoara, (RO)

Signed and Sealed this  
Twenty-ninth Day of October, 2024

Katherine Kelly Vidal  
*Director of the United States Patent and Trademark Office*